(12) United States Patent
Chen et al.

(10) Patent No.: US 10,475,744 B2
(45) Date of Patent: Nov. 12, 2019

(54) VERTICAL GATE-ALL-AROUND TRANSISTOR AND MANUFACTURING METHOD THEREOF

(71) Applicant: United Microelectronics Corp., Hsinchu (TW)

(72) Inventors: Kuan-Hung Chen, Taichung (TW); Rung-Yuan Lee, New Taipei (TW); Chun-Tsen Lu, Tainan (TW)

(73) Assignee: United Microelectronics Corp., Hsinchu (TW)

( * ) Notice: Subject to any disclaimer, the term of this patent is extended or adjusted under 35 U.S.C. 154(b) by 9 days.

(21) Appl. No.: 15/727,380

(22) Filed: Oct. 6, 2017

(65) Prior Publication Data

US 2019/0074250 A1 Mar. 7, 2019

(30) Foreign Application Priority Data

Sep. 7, 2017 (CN) .......................... 2017 1 0800066

(51) Int. Cl.
| | |
|---|---|
| *H01L 23/532* | (2006.01) |
| *H01L 21/02* | (2006.01) |
| *H01L 21/762* | (2006.01) |
| *H01L 29/423* | (2006.01) |
| *H01L 29/06* | (2006.01) |
| *B82Y 99/00* | (2011.01) |

(52) U.S. Cl.
CPC .... *H01L 23/5329* (2013.01); *H01L 21/02019* (2013.01); *H01L 21/762* (2013.01); *H01L 29/0676* (2013.01); *H01L 29/42392* (2013.01); *B82Y 99/00* (2013.01)

(58) Field of Classification Search
USPC ......................................................... 257/506
See application file for complete search history.

(56) References Cited

U.S. PATENT DOCUMENTS

| | | | | |
|---|---|---|---|---|
| 9,559,164 | B2 | 1/2017 | Feng et al. | |
| 2008/0230802 | A1* | 9/2008 | Bakkers | H01L 29/04 257/190 |
| 2008/0251862 | A1* | 10/2008 | Fonash | B82Y 10/00 257/408 |
| 2010/0072460 | A1* | 3/2010 | Bjoerk | B82Y 10/00 257/24 |
| 2010/0176459 | A1* | 7/2010 | Wernersson | B82Y 10/00 257/392 |
| 2012/0280292 | A1* | 11/2012 | Bjoerk | B82Y 10/00 257/288 |
| 2012/0305893 | A1* | 12/2012 | Colinge | B82Y 10/00 257/29 |
| 2015/0179798 | A1* | 6/2015 | Clendenning | H01L 29/7851 257/401 |

(Continued)

*Primary Examiner* — Nilufa Rahim
(74) *Attorney, Agent, or Firm* — J.C. Patents (57) ABSTRACT

A semiconductor device and a method of fabricating the same are provided. The semiconductor device includes a substrate, an isolation structure, an outer structure, and a gate structure. The isolation structure is disposed on the substrate. The outer structure surrounds a sidewall of the isolation structure. The gate structure surrounds a central part of the outer structure, so that the central part covered by the gate structure becomes a channel region, and the outer structure at both sides of the central part respectively becomes a source region and a drain region.

14 Claims, 6 Drawing Sheets

(56) References Cited

U.S. PATENT DOCUMENTS

2016/0093745 A1* 3/2016 Diaz ................. H01L 29/78696
 257/29
2016/0190446 A1* 6/2016 Schulze ............. H01L 51/0002
 438/478

* cited by examiner

VERTICAL GATE-ALL-AROUND TRANSISTOR AND MANUFACTURING METHOD THEREOF

CROSS-REFERENCE TO RELATED APPLICATION

This application claims the priority benefit of China application serial no. 201710800066.2, filed on Sep. 7, 2017. The entirety of the above-mentioned patent application is hereby incorporated by reference herein and made a part of this specification.

BACKGROUND OF THE INVENTION

1. Field of the Invention

The invention relates to an integrated circuit and a method of fabricating the same, particularly to a semiconductor device and a method of fabricating the same.

2. Description of Related Art

With rapid advancement of semiconductor fabricating technologies, the size of the entire circuit device must be constantly reduced to increase the integration level of the device, and thereby the speed and the performance of the device can be improved. At present, three-dimensional or non-planar multi-gate transistors have been developed to replace planar devices. For example, dual-gate fin field effect transistor (FinFET) devices, tri-gate FinFET devices, Ω (omega) FinFET devices, and other non-planar multi-gate transistors have already been proposed. Now, gate-all-around (GAA) transistor devices that use nanowires as channels are being developed as a scheme to continually enhance the integration level and the performance of the devices. However, conventional nanowire transistors have a problem of excessive current leakage, which reduces reliability.

SUMMARY OF THE INVENTION

The invention provides a semiconductor device and a method of fabricating the same, wherein a sidewall of an isolation structure is surrounded by a channel material to reduce current leakage and increase the surface area of an active region, thereby increasing an $I_{on}$ current.

Specifically, the invention provides a semiconductor device including a substrate, an isolation structure, an outer structure, and a gate structure is provided. The isolation structure is disposed on a substrate. The outer structure surrounds a sidewall of the isolation structure. The gate structure surrounds a central part of the outer structure, such that the central part covered by the gate structure becomes a channel region, and the outer structure at both sides of the central part respectively becomes a source region and a drain region.

In an embodiment of the invention, the isolation structure is perpendicular to a top surface of the substrate to form a vertical nanowire structure.

In the embodiment of the invention, a material of the isolation structure includes air, a dielectric material, or a combination thereof.

In the embodiment of the invention, the dielectric material includes silicon oxide, silicon nitride, silicon oxynitride, or a low dielectric constant (low-k) material with a dielectric constant below 4.

In the embodiment of the invention, a material of the outer structure includes silicon, germanium, a 2D material, or a combination thereof.

In the embodiment of the invention, the 2D material includes graphene, a metal chalcogenide, or a combination thereof.

In the embodiment of the invention, the metal chalcogenide includes metal atoms of one of Mo, W, Nb, V, Ta, Ti, Zr, Hf, Tc, Re, Cu, Ga, In, Sn, Ge, and Pb and chalcogen atoms of one of S, Se, and Te.

In the embodiment of the invention, a conductivity type of the channel region, a conductivity type of the source region, and a conductivity type of the drain region are the same.

In the embodiment of the invention, a conductivity type of the source region and a conductivity type of the drain region are the same, while the conductivity type of the source region and the conductivity type of the drain region are different from a conductivity of the channel region.

In the embodiment of the invention, the isolation structure includes: a main portion and a protrusion portion. The main portion blankets the substrate. The protrusion portion protrudes vertically from the top surface of the main portion. The outer structure surrounds a sidewall of the protrusion portion.

In the embodiment of the invention, the number of the protrusion portion is plural, and a diameter of one of the plurality of protrusion portions is the same as a diameter of another of the plurality of protrusion portions.

In the embodiment of the invention, the number of the protrusion portions is plural, and a diameter of one of the plurality of protrusion portions is different from a diameter of another of the plurality of protrusion portions.

In the embodiment of the invention, the gate structure includes a gate dielectric layer and a gate electrode, and the gate dielectric layer is located between the gate electrode and the channel region.

The invention provides a method of fabricating a semiconductor, and the method includes following steps: forming an isolation structure on a substrate, wherein the isolation structure is perpendicular to a top surface of the substrate; forming an outer structure on a sidewall of the isolation structure; forming a sacrificial layer on the substrate, wherein the sacrificial layer surrounds a lower part the outer structure; forming a gate structure on the sacrificial layer, wherein the gate structure surrounds a central part of the outer structure, such that the central part covered by the gate structure becomes a channel region, and the lower part and an upper part of the outer structure respectively become a source region and a drain region; and removing the sacrificial layer.

In the embodiment of the invention, the step of forming on the substrate the isolation structure perpendicular to the top surface of the substrate is described below. An isolation structure material and a mask pattern are sequentially formed on the substrate. A part of the isolation structure material is removed with use of the mask pattern as a mask. A rounding process is performed on a remainder part of the isolation structure material.

In the embodiment of the invention, the rounding process includes a standard clean 1 process (SC1), a cleaning process containing dilute hydrofluoric acid (DHF), or a combination thereof.

In the embodiment of the invention, the step of forming the outer structure on the sidewall of the isolation structure is described below. A seed layer is conformally formed on the isolation structure after the rounding process is performed. A channel material is epitaxially grown on the seed layer. The seed layer and the channel material are etched back to expose a top surface of the mask pattern.

In the embodiment of the invention, the channel material includes silicon, germanium, a 2D material, or a combination thereof.

In the embodiment of the invention, a material of the sacrificial layer includes silicon nitride, silicon oxynitride, silicon carbide, or a combination thereof.

In the embodiment of the invention, a material of the isolation structure includes air, a dielectric material, or a combination thereof.

Based on the above, in the embodiments of the invention, the isolation structure perpendicular to the top surface of the substrate is formed on the substrate, and the outer structure surrounds the sidewall of the isolation structure. Afterwards, the gate structure surrounds the central part of the outer structure, such that the central part covered by the gate structure becomes the channel region, and the outer structure at both sides of the central part respectively becomes the source region and the drain region. Compared with the conventional nanowire transistors, the semiconductor device provided in the embodiments of the invention can have the reduced current leakage, so as to enhance the reliability of the semiconductor device. In addition, according to the embodiments of the invention, the surface area of the active region can be expanded, thereby increasing the $I_{on}$ current.

To make the above features and advantages of the invention more comprehensible, several embodiments accompanied with drawings are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

The invention is more fully described when referenced to the drawings of the embodiments of the invention. However, the invention may also be embodied in various forms and should not be limited to the embodiments described hereto. The thickness of layers and areas in the drawings are magnified for clarity. Same or similar reference numbers refer to the same or similar components and may not be repeated in the paragraphs below.

FIG. 1A to FIG. 1J are schematic cross-sectional views illustrating a process of fabricating a semiconductor device according to a first embodiment of the invention. In the embodiment, the semiconductor device may be a nanowire transistor having an isolation structure, but the invention is not limited thereto.

Figure 1A:
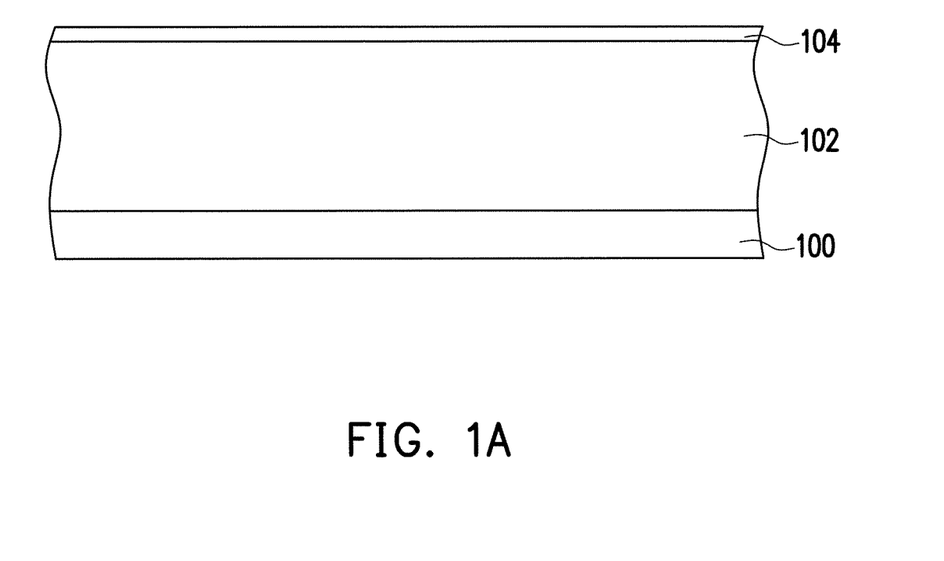
FIG. 1A to FIG. 1J are schematic cross-sectional views illustrating a process of fabricating a semiconductor device according to a first embodiment of the invention.

Referring to FIG. 1A, first, an isolation structure material 102 and a mask layer 104 are sequentially formed on a substrate 100. In an embodiment, the substrate 100 may be, for example, a semiconductor substrate, a semiconductor compound substrate, or a semiconductor over insulator (SOI) substrate. The semiconductor is, for example, atoms in Group IVA, such as silicon or germanium. The semiconductor compound is, for example, a semiconductor compound formed by atoms in Group IVA, such as silicon carbide or silicon germanium, or a semiconductor compound formed by atoms in Group IIIA and a Group VA, such as gallium arsenide. In the embodiment, the isolation structure material 102 includes a dielectric material. The dielectric material includes silicon oxide, silicon nitride, silicon oxynitride, or a low dielectric constant material with a dielectric constant below 4. In the embodiment, the mask layer 104 may be a hard mask layer, and an etching selectivity ratio of the hard mask layer to the isolation structure material 102 is high. In the embodiment, the mask layer 104 includes but is not limited to silicon nitride.

Figure 1B:
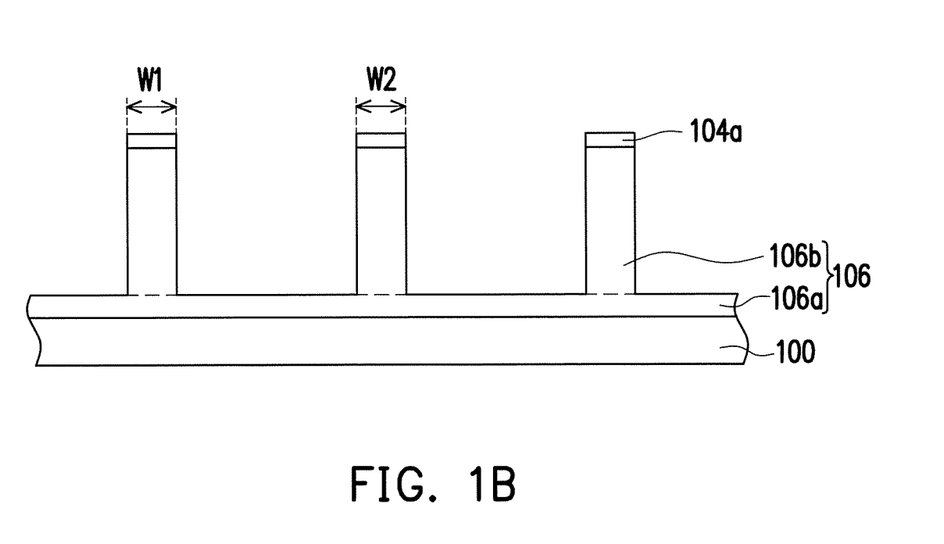

Referring to FIG. 1A and FIG. 1B, the mask layer 104 is patterned to form a mask pattern 104a. Then, a part of the isolation structure material 102 is removed with use of the mask pattern 104a as a mask, so that an isolation structure 106 perpendicular to a top surface of the substrate 100 is formed on the substrate 100. In detail, the isolation structure 106 includes a main portion 106a and a plurality of protrusion portions 106b. The main portion 106a is formed to blanket the substrate 100. The protrusion portions 106b protrude vertically from a top surface of the main portion 106a. Referring to FIG. 1B, the protrusion portions 106b of the isolation structure 106 are separated from each other, such that the isolation structure 106 forms a comb-like structure. In an embodiment, the protrusion portions 106b may be columnar structures. The columnar structures include circular columnar structures, elliptical columnar structures, polygonal columnar structures, irregular columnar structures, and so on. In an embodiment, a width (or diameter) W1 of one of the protrusion portions 106b may be within a range from 4 nm to 10 nm. A width (or diameter) W2 of another of the protrusion portions 106b may be within a range from 4 nm to 10 nm. That is, the protrusion portions 106b of the isolation structure 106 may be considered as a vertical nanowire structure. In an embodiment, the width W1 may be equal to the width W2; that is, the widths of the protrusion portions 106b are the same. In an alternative embodiment, the width W1 may not be equal to the width W2; that is, the widths of the protrusion portions 106b may be different.

In the embodiment, after a part of the isolation structure material 102 is removed, a rounding process may be performed on a remainder part (hereinafter referred to as the isolation structure 106) of the isolation structure material 102, so as to reduce surface roughness of the isolation structure 106. Therefore, the isolation structure 106 undergoing the rounding process has a smoother contour compared to the contour of the isolation structure 106 which has not experienced the rounding process. In an embodiment, the rounding process may be a cleaning process, including a standard clean 1 (SC1) process, a cleaning process containing dilute hydrofluoric acid (DHF), or a combination thereof. Specifically, the SC1 process includes a step of using $NH_4OH$, $H_2O_2$, and $H_2O$ cleaning solution. The proportion of $NH_4OH$, $H_2O_2$, and $H_2O$ may be adjusted to comply with specific needs and is not limited in this invention.

Figure 1C:
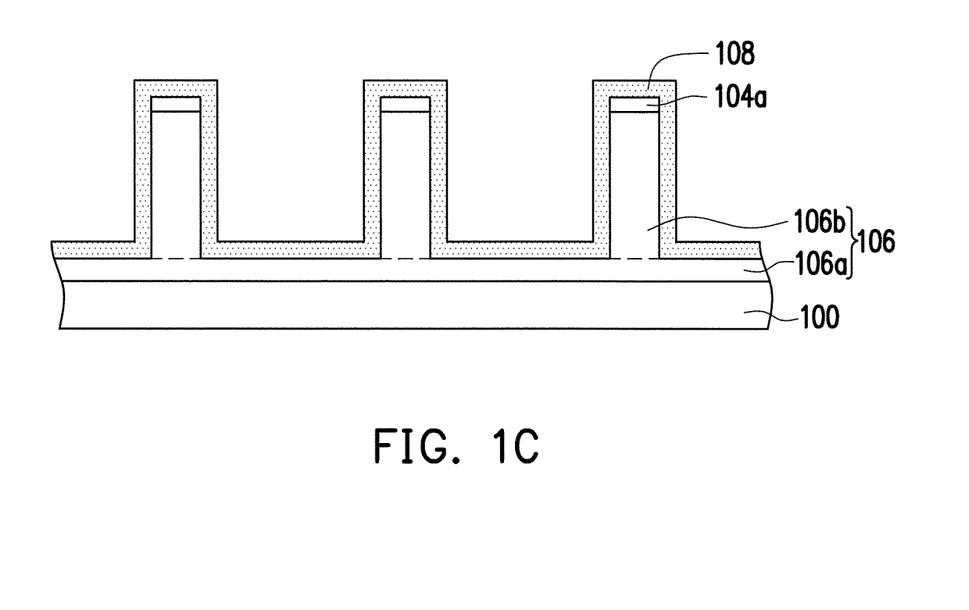

Referring to FIG. 1C, a seed layer 108 is conformally formed on the substrate 106 after the rounding process. The seed layer 108 conformally covers a surface of the isolation structure 106 and a surface of the mask pattern 104a. In an embodiment, a material of the seed layer 108 includes silicon, germanium, carbon, or a combination thereof, and a method of forming the seed layer 108 includes atomic layer deposition (ALD).

Figure 1D:
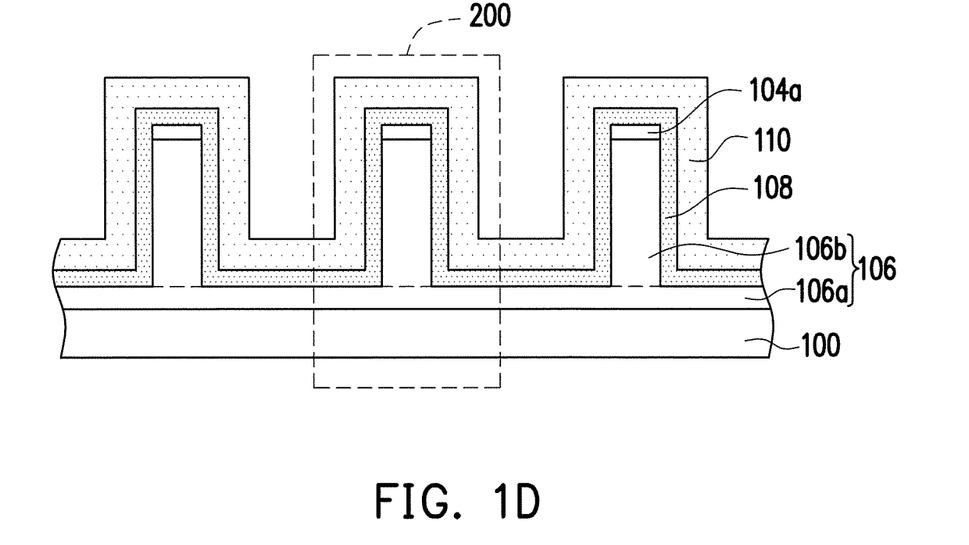

Referring to FIG. 1D, a channel material 110 is epitaxially grown on the seed layer 108. The channel material 110 conformally covers a surface of the seed layer 108. In an embodiment, the channel material 110 includes silicon, germanium, a 2D material, or a combination thereof. The 2D material includes graphene, a metal chalcogenide, or a combination thereof. The metal chalcogenide includes metal atoms of one of Mo, W, Nb, V, Ta, Ti, Zr, Hf, Tc, Re, Cu, Ga, In, Sn, Ge, and Pb and chalcogen atoms of one of S, Se, and Te. In an embodiment, when the channel material 110 is epitaxially grown, an N-type dopant or a P-type dopant may be doped, such that the channel material 110 is of N-type conductivity or P-type conductivity. For example, when the channel material 110 is silicon, the N-type dopant may be phosphorus or arsenic; the P-type dopant may be boron. The doping concentration of the channel material 110 may be adjusted to comply with specific needs and is not limited in this invention. In an alternative embodiment, a doped layer (not shown in the drawings) may also be formed on the channel material 110. Afterwards, an annealing process is performed, such that the dopant in the doped layer is diffused into the channel material 110 to form the channel material 110 of the N-type conductivity or the P-type conductivity.

For the sake of clarity, FIG. 1E to FIG. 1J are magnified views of the part 200 in FIG. 1D.

Figure 1E:
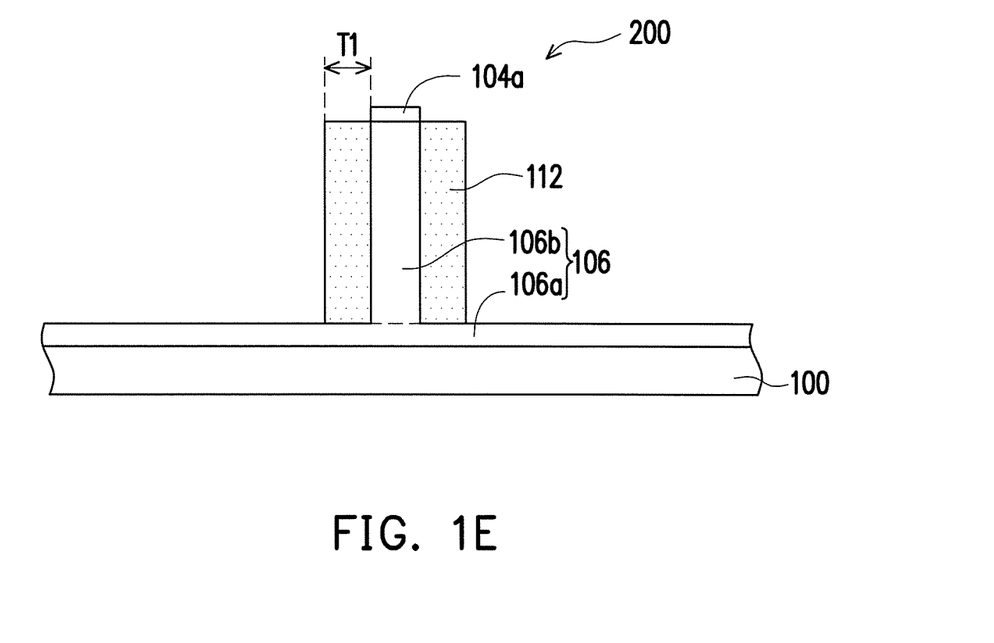

Referring to FIG. 1D and FIG. 1E, the seed layer 108 and the channel material 110 are etched back to expose a top surface of the mask pattern 104a and a top surface of the main portion 106a of the isolation structure 106. As shown in FIG. 1E, the remaining seed layer 108 and channel material 110 (hereinafter referred to as an outer structure 112, wherein the two-layered seed layer 108 and the channel material 110 are depicted as the single-layered outer structure 112) cover and surround the sidewall of the protrusion portions 106b of the isolation structure 106. In this case, the top surface of the outer structure 112 is lower than the top surface of the mask pattern 104a. In an embodiment, a thickness T1 of the outer structure 112 may be within a range from 10 nm to 40 nm.

Figure 1F:
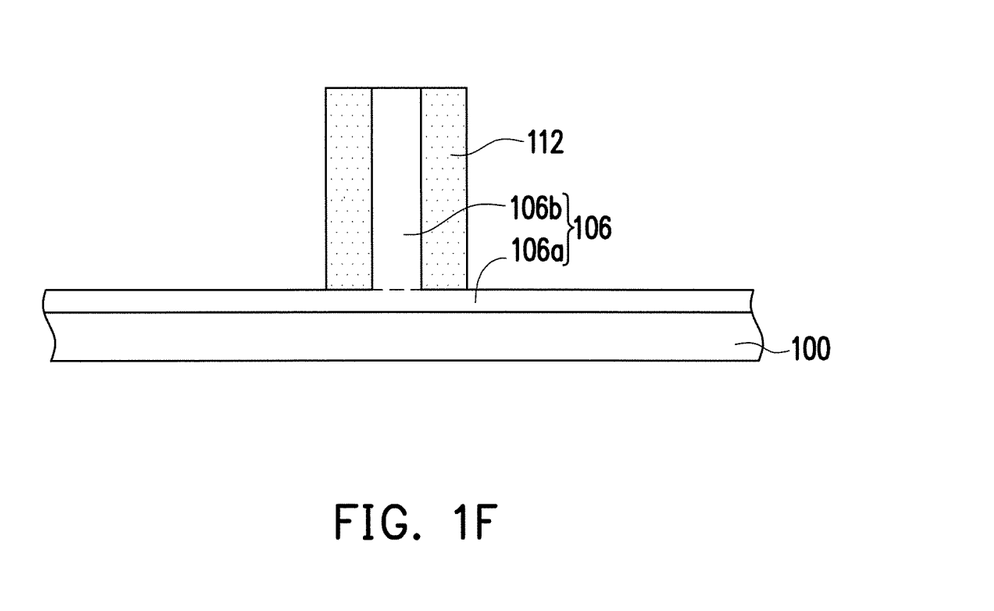

Referring to FIG. 1E and FIG. 1F, the mask pattern 104a is removed to expose a top surface of the protrusion portions 106b of the isolation structure 106. In an embodiment, the top surface of the isolation structure 106 is coplanar with the outer structure 112, but the invention is not limited thereto. In an alternative embodiment, the protrusion portions 106b of the isolation structure 106 may be non-coplanar with the outer structure 112.

Figure 1G:
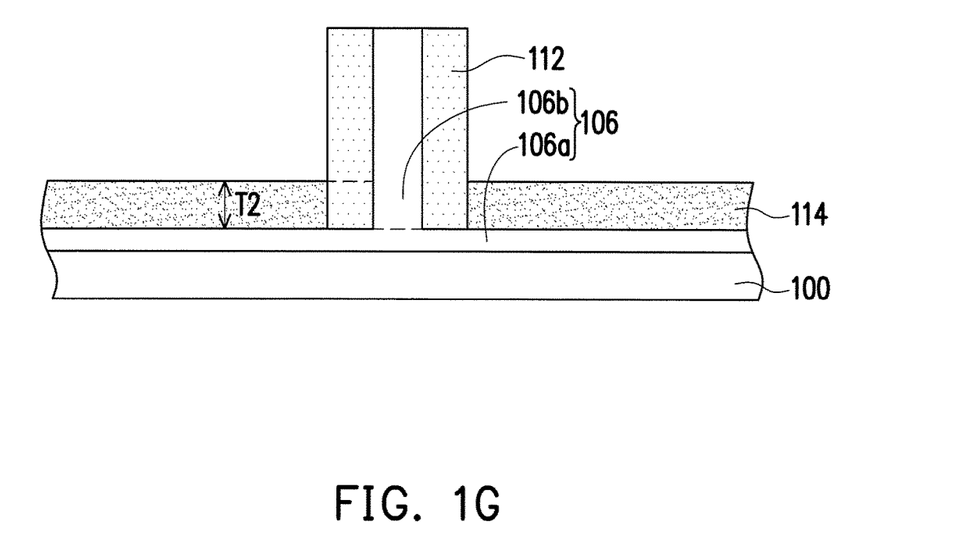

Referring to FIG. 1G, a sacrificial layer 114 is formed on the substrate 100. The sacrificial layer 114 covers a top surface of the main portion 106a of the isolation structure 106 and surrounds a lower part 112a of the outer structure 112. In an embodiment, a material of the sacrificial layer 114 includes silicon nitride, silicon oxynitride, silicon carbide, or a combination thereof, and a method of forming the sacrificial layer 114 includes chemical vapor deposition (CVD). In an embodiment, a thickness T2 of the sacrificial layer 114 may be within a range from 20 nm to 60 nm, but the invention is not limited thereto. In the embodiment, the thickness T2 of the sacrificial layer 114 may serve to define the surface area of the source region or the drain region.

Figure 1H:
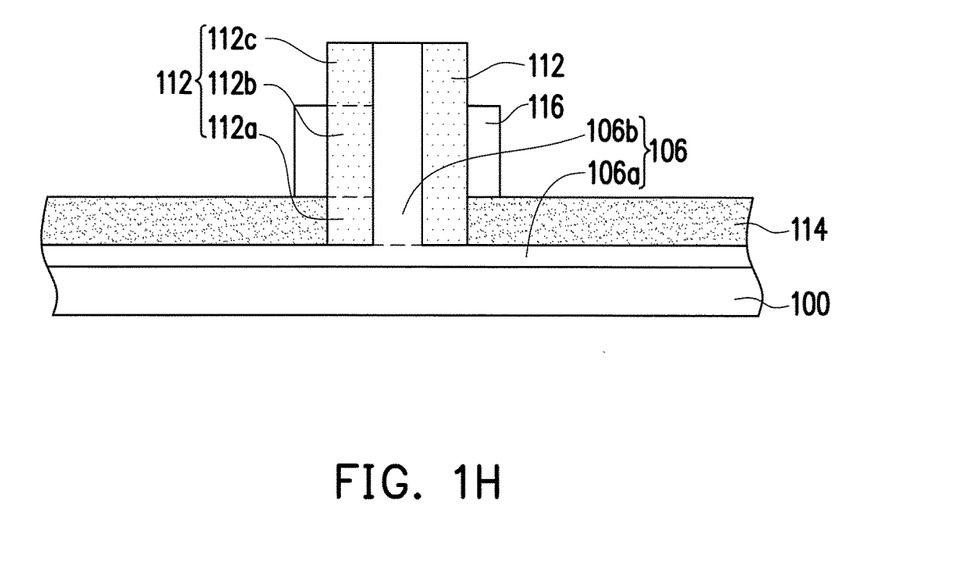
Figure 1I:
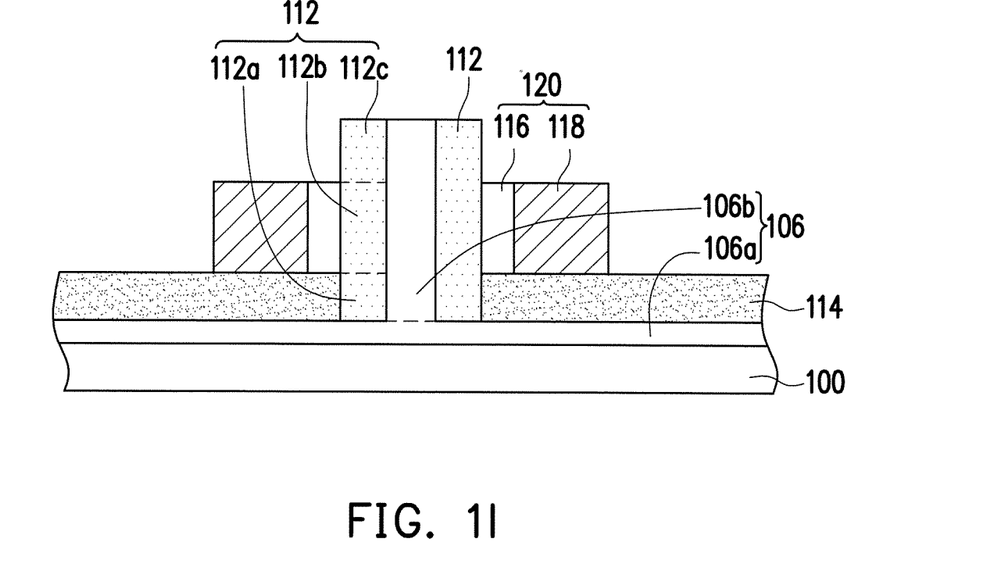

Referring to FIG. 1H and FIG. 1I, a gate structure 120 is formed on the sacrificial layer 114. The gate structure 120 surrounds a central part 112b of the outer structure 112. Specifically, as shown in FIG. 1H, a gate dielectric layer 116 is formed on the sacrificial layer 114, and the gate dielectric layer 116 surrounds the central part 112b of the outer structure 112. In an embodiment, a material of the gate dielectric layer 116 includes silicon oxide or a high dielectric constant material with a dielectric constant greater than 4, such as silicon nitride, tantalum oxide, aluminum oxide, hafnium oxide, or a combination thereof. A method of forming the gate dielectric layer 116 may be thermal oxidation, ALD, or CVD. Then, as shown in FIG. 1I, a gate electrode 118 is formed on the sacrificial layer 114. The gate electrode 118 surrounds a surface of the gate dielectric layer 116, such that the gate dielectric layer 116 is positioned between the gate electrode 118 and the central part 112b (or the channel region). In an embodiment, a material of the gate electrode 118 includes a conductive material, which may be, for example, metal, polysilicon, metal silicide, or a combination thereof. A method of forming the gate electrode 118 may be physical vapor deposition (PVD) or CVD.

Figure 1J:
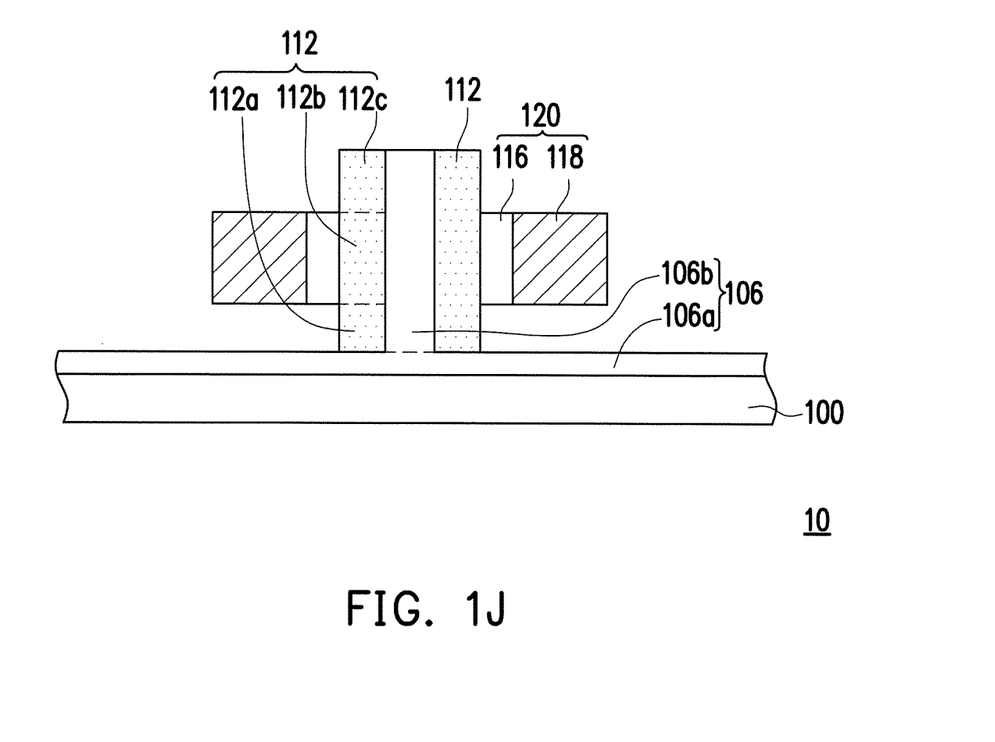

Referring to FIG. 1I and FIG. 1J, the sacrificial layer 114 is removed to expose the lower part 112a of the outer structure 112, so as to form a nanowire transistor 10 having the isolation structure 106. As shown in FIG. 1J, the outer structure 112 includes the lower part 112a, the central part 112b, and an upper part 112c. The central part 112b is located between the lower part 112a and the upper part 112c. In an embodiment, the central part 112b covered by the gate structure 120 may be considered as the channel region, while the lower part 112a and the upper part 112c may be considered the source region and the drain region. In an embodiment, the channel region, the source region, and the drain region may be of the same conductivity type to form a junctionless FET. In an alternative embodiment, the source region and the drain region may be of the same conductivity type, while the conductivity type of the source region and the conductivity type of the drain region are different from the conductivity type of the channel region, so as to form a metal-oxide-semiconductor field effect transistor (MOSFET). For example, the source region and the drain region may be of the N-type conductivity, and the channel region may be of the P-type conductivity.

It is worth noting that when compared to the conventional nanowire transistors, the nanowire transistor 10 provided in the embodiment has the isolation structure 106 (or the protrusion portions 106b) reducing current leakage, and thereby device reliability may be enhanced. On the other hand, the width or diameter of the isolation structure 106 (or the protrusion portions 106b) may be adjusted according to the embodiment to increase the surface area of the active region or the channel region, thereby increasing the $I_{on}$ current of the device.

In the previous embodiments, a material of the isolation structure 106 includes a dielectric material, but the invention is not limited thereto. In an alternative embodiment, the isolation structure 106 may be air or an air gap, which may reduce the dielectric constant of the isolation structure 106 and may further reduce the possibility of current leakage. When the isolation structure 106 is air or an air gap, the method of forming the isolation structure 106 includes, for example, the following steps. After removing the sacrificial layer 114 (as shown in FIG. 1J), a dielectric layer (not shown in the drawings) is formed on the substrate 100 to cover the entire surface of the nanowire transistor 10. Afterwards, the dielectric layer is patterned to expose a top surface of the protrusion portions 106b of the isolation structure 106. Then, the protrusion portions 106b of the isolation structure 106 are removed to form an air gap (not shown in the drawings). The air gap is then sealed to form the nanowire transistor (not shown in the drawings) with the air gap.

Figure 2:
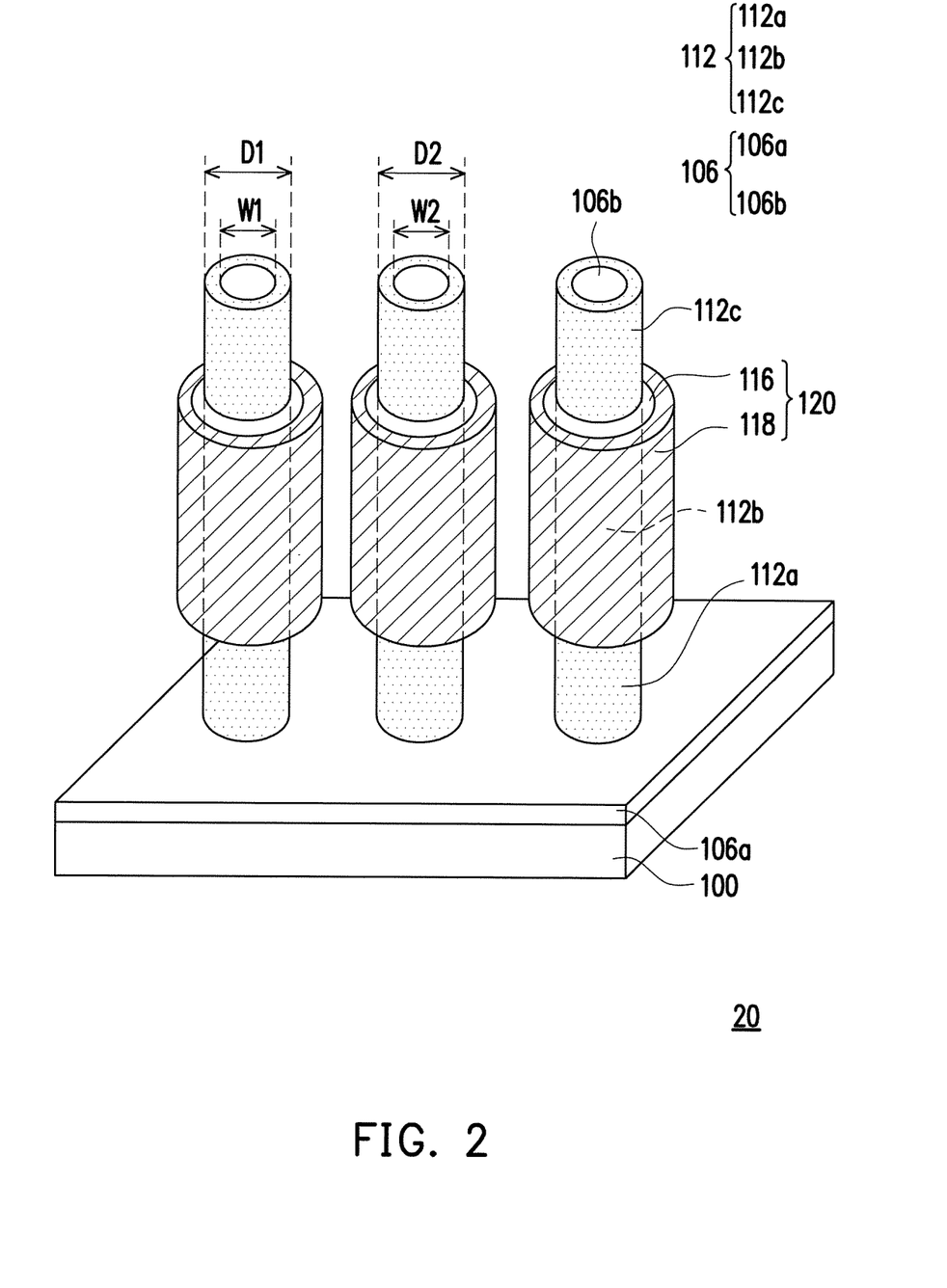
FIG. 2 is a schematic cross-sectional view illustrating a semiconductor device according to a second embodiment of the invention.

FIG. 2 is a schematic cross-sectional view illustrating a semiconductor device according to a second embodiment of the invention.

A nanowire transistor 20 provided in the embodiment includes the substrate 100, the isolation structure 106, the outer structure 112, and the gate structure 120. The isolation structure 106 is disposed on the substrate 100. Specifically, the isolation structure 106 includes the main portion 106a and the protrusion portions 106b. The main portion 106a is formed to blanket the substrate 100. The protrusion portions 106b protrude vertically from the top surface of the main portion 106a. The outer structure 112 surrounds a sidewall of the protrusion portions 106b of the isolation structure 106. The gate structure 120 surrounds the central part 112b of the outer structure 112, such that the central part 112b covered by the gate structure 120 becomes the channel region, and the outer structure (i.e., the lower part 112a and the upper part 112c) at both sides of the central part 112b respectively becomes the source region and the drain region.

In an embodiment, the width (or the diameter) W1 of one of the protrusion portions 106b may be equal to the width (or the diameter) W2 of another of the protrusion portions 106b. In an alternative embodiment, the width W1 may not be equal to the width W2; that is, the width of each of the protrusion portions 106b is different. Therefore, a diameter D1 of the outer structure 112 which surrounds one of the protrusion portions 106b may or may not be equal to a diameter D2 of the outer structure 112 which surrounds another of the protrusion portions 106b. In other words, in the nanowire transistor 20 provided in the embodiment, the width of the protrusion portions 106b of the isolation structure 106 or the diameter of the outer structure 112 which surrounds the protrusion portions 106b may be adjusted, so as to meet the voltage requirements of various devices.

To sum up, in the embodiments of the invention, the isolation structure perpendicular to the top surface of the substrate is formed on the substrate, and the outer structure surrounds the sidewall of the isolation structure. Afterwards, the gate structure surrounds the central part of the outer structure, such that the central part covered by the gate structure becomes the channel region, and the outer structure at both sides of the central part respectively becomes the source region and the drain region. Compared with the conventional nanowire transistors, the semiconductor device provided herein can have the reduced current leakage, so as to enhance the reliability of semiconductor devices. In addition, the invention can increase the surface area of the active region, thereby increasing the $I_{on}$ current.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A semiconductor device, comprising:
   an isolation structure, disposed on a substrate, wherein the isolation structure comprises:
   a main portion, blanketing the substrate; and
   a protrusion portion, protruding vertically from a top surface of the main portion, wherein the protrusion portion is an air gap and the main portion comprises a dielectric material;
   an outer structure, surrounding the protrusion portion of the isolation structure, wherein the outer structure is in direct contact with the protrusion portion and the outer structure is separated from the substrate by the main portion;
   wherein a material of the outer structure comprises a metal chalcogenide 2D material; and
   a gate structure, surrounding a central part of the outer structure, such that the central part covered by the gate structure becomes a channel region, and the outer structure at both sides of the central part respectively becomes a source region and a drain region.

2. The semiconductor device of claim 1, wherein the isolation structure is perpendicular to a top surface of the substrate to form a vertical nanowire structure.

3. The semiconductor device of claim 1, wherein the dielectric material comprises silicon oxide, silicon nitride, silicon oxynitride, or a low dielectric constant material with a dielectric constant below 4.

4. The semiconductor device of claim 1, wherein the metal chalcogenide 2D material comprises metal atoms of one of Mo, W, Nb, V, Ta, Ti, Zr, Hf, Tc, Re, Cu, Ga, In, Sn, Ge, and Pb and chalcogen atoms of one of S, Se, and Te.

5. The semiconductor device of claim 1, wherein a conductivity type of the channel region, a conductivity type of the source region, and a conductivity type of the drain region are the same.

6. The semiconductor device of claim 1, wherein a conductivity type of the source region and a conductivity type of the drain region are the same, while the conductivity type of the source region and the conductivity type of the drain region are different from a conductivity type of the channel region.

7. The semiconductor device of claim 1, wherein the protrusion portion comprises a plurality of protrusion portions, and a diameter of one of the plurality of protrusion portions is the same as a diameter of another of the plurality of protrusion portions.

8. The semiconductor device of claim 1, wherein the protrusion portion comprises a plurality of protrusion portions, and a diameter of one of the plurality of protrusion portions is different from a diameter of another of the plurality of protrusion portions.

9. The semiconductor device of claim 1, wherein the gate structure comprises a gate dielectric layer and a gate electrode, and the gate dielectric layer is located between the gate electrode and the channel region.

10. A method of fabricating a semiconductor device, comprising:
    forming an isolation structure on a substrate, wherein the isolation structure comprises:
    a main portion, blanketing the substrate, wherein the main portion comprises a dielectric material; and
    a protrusion portion, protruding vertically from a top surface of the main portion;
    forming an outer structure on a sidewall of the protrusion portion of the isolation structure;
    wherein a material of the outer structure comprises a metal chalcogenide 2D material;
    forming a sacrificial layer on the substrate, the sacrificial layer surrounding a lower part the outer structure;
    forming a gate structure on the sacrificial layer, the gate structure surrounding a central part of the outer structure, such that the central part covered by the gate structure becomes a channel region, and the lower part and an upper part of the outer structure respectively become a source region and a drain region;

removing the sacrificial layer;

forming a dielectric layer on the substrate to cover the gate structure and the outer structure;

patterning the dielectric layer to expose a top surface of the protrusion portion of the isolation structure;

removing the protrusion portion of the isolation structure to form an air gap on the main portion; and sealing the air gap, wherein the outer structure is in direct contact with the air gap and the outer structure is separated from the substrate by the main portion.

11. The method of fabricating the semiconductor device of claim 10, wherein the forming the isolation structure on the substrate comprises:

sequentially forming an isolation structure material and a mask pattern on the substrate;

removing a part of the isolation structure material with use of the mask pattern as a mask; and performing a rounding process on a remainder part of the isolation structure material.

12. The method of fabricating the semiconductor device of claim 11, wherein the rounding process comprises a standard clean 1 process, a cleaning process containing dilute hydrofluoric acid, or a combination thereof.

13. The method of fabricating the semiconductor device of claim 11, wherein the forming the outer structure on the sidewall of the protrusion portion of the isolation structure comprises:

conformally forming a seed layer on the isolation structure after performing the rounding process;

epitaxially growing a channel material on the seed layer; and etching back the seed layer and the channel material to expose a top surface of the mask pattern.

14. The method of fabricating the semiconductor device of claim 10, wherein a material of the sacrificial layer comprises: silicon nitride, silicon oxynitride, silicon carbide, or a combination thereof.

* * * * *